United States Patent

[11] 3,617,899

[72] Inventors Nikolai Goncharoff
Roselle;
Kamil Y. Jabbar, River Grove, both of Ill.

[21] Appl. No. 791,468
[22] Filed Jan. 15, 1969
[45] Patented Nov. 2, 1971

[73] Assignee Motorola, Inc.
Franklin Park, Ill.

[54] TUNING CONTROL FOR MULTIPLE ELECTRONICALLY TUNED CIRCUITS
13 Claims, 2 Drawing Figs.

[52] U.S. Cl. .......... 325/452, 323/75 F, 325/430, 331/36, 334/11
[51] Int. Cl. .......... H04b 1/16
[50] Field of Search .......... 325/335, 430, 438, 452, 453, 468, 459, 457; 323/75 F; 331/36; 334/11, 14, 15

[56] References Cited

UNITED STATES PATENTS 3,008,084 11/1961 Cotton .......... 323/75
3,354,397 11/1967 Wittig .......... 325/453 X

OTHER REFERENCES

Department of the Army Technical Manual, TM11- 690, " Basic Theory and Application of Transistors," Mar. 1959, pg. 99.

*Primary Examiner*—Robert L. Griffin
*Assistant Examiner*—R. S. Bell
*Attorney*—Mueller and Aichele

ABSTRACT: Simultaneous tuning and tracking of the tuned circuits in a radio receiver using electronically tuned voltage variable capacitors in the tuned circuits of the receiver is accomplished by providing a regulated DC supply across a four-arm bridge circuit, three arms of which constitute resistive elements and the fourth arm of which is a Zener diode. The diagonal of the bridge includes a potentiometer, the tap of which provides a variable tuning voltage which is applied to one terminal of the voltage variable capacitors in each of the tuned circuits. In order to provide tracking of the tuned circuits to different frequencies, the other terminal of the voltage variable capacitors in each of the circuits is provided with different DC reference potentials, so that the circuits are tuned together to provide tracking with a predetermined offset.

PATENTED NOV 2 1971 3,617,899

INVENTORS.
NIKOLAI GONCHAROFF
KAMIL Y. JABBAR

BY Mueller, Aichele & Rauner
ATTORNEYS.

TUNING CONTROL FOR MULTIPLE ELECTRONICALLY TUNED CIRCUITS

BACKGROUND OF THE INVENTION

Electronic tuning of radio receivers, especially automobile radio receivers, is attractive since it makes possible the location of tuning stations remote from the radio receiver itself. As a consequence, remote tuning stations may be positioned in the arm rests on the doors of the front and back seat of an automobile so that the radio can be tuned from any location within the automobile. In order to make electronically tuned automobile radios more attractive, both from a standpoint of operation and economically, it is desirable to provide a single tuning knob or source of tuning voltage at each tuning station for simultaneously tuning all of the tuned circuits of the radio. In order to accomplish this, it is desirable to provide a means for causing the same variable tuning voltage to cause the tuned circuits to be tuned to different frequencies without the necessity of providing extra trimming and padding condensers for this purpose.

In addition, it is desirable to provide an inexpensive regulated DC tuning voltage for the voltage variable capacitors in the tuned circuits, so that tuning of the radio is relatively unaffected by changes in the supply voltage potential.

SUMMARY OF THE INVENTION

It is an object of this invention to simultaneously tune several electronically tuned circuits.

It is another object of this invention to simultaneously tune a plurality of tuned circuits, including voltage variable capacitors, to different frequencies from a single potentiometer tap.

It is another object of this invention in an electronically tuned radio receiver to provide predetermined offset voltages and to simultaneously tune the tuned circuits of the receiver to different frequencies from a single source of tuning voltage.

In a preferred embodiment of this invention, voltage variable capacitors are located in the tuned circuits of a radio receiver. A single source of variable DC control voltage is applied to comparable terminals of each of the voltage variable capacitors in each of the tuned circuits, and a different DC reference potential is applied to at least the voltage variable capacitors in two of the tuned circuits; so that the resultant voltage applied across the voltage variable capacitors in those two tuned circuits differs, as the variable voltage is changed, in an amount determined by the difference in the DC reference voltage applied to the voltage variable capacitors. Thus, tuning of the tuned circuits to different frequencies is accomplished from a single source of control voltage; and the tuning frequencies of the circuits track with a predetermined offset.

DETAILED DESCRIPTION

Figures 1, 2:
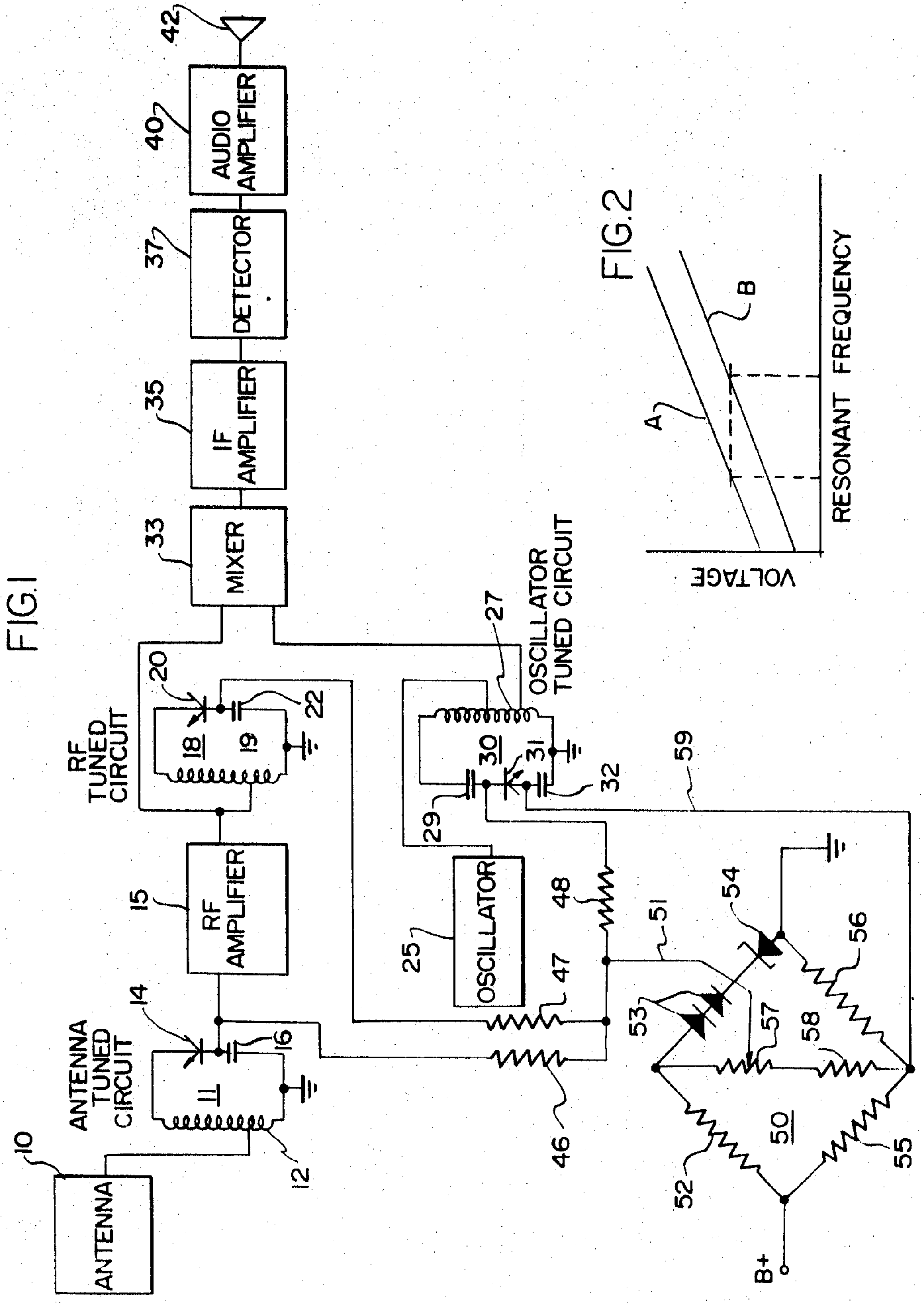
FIG. 1 of the drawing is a schematic diagram, partially in block form, of a preferred embodiment of the invention.
FIG. 2 shows voltage/frequency relationships useful in describing the operation of the circuit shown in FIG. 1.

Referring now to the drawing, there is shown in FIG. 1 a wave signal radio receiver with input signals appearing at an antenna 10, which is connected to an impedance matching point on the primary winding 12 of an antenna tuned circuit 11 including a blocking capacitor 16 and a voltage variable capacitor or reactance device 14. The voltage variable capacitor 14 is a two-terminal PN junction semiconductor device exhibiting a change in capacitance which is proportional to a change in the direct current bias voltage applied across the device. By varying the direct current bias across the voltage variable capacitor 14, the antenna 10 can be tuned through a predetermined radio frequency range.

The received signal then is coupled to an RF amplifier 15 where it is amplified and connected to an impedance matching point on the primary winding 19 of an RF tuned circuit 18 which includes a second voltage variable capacitor 20 and a blocking capacitor 22. The signals from the RF amplifier 15 are supplied as one input to a mixer circuit 33 where they are heterodyned with signals obtained from an impedance matching point on the primary winding 27 of a third tuned circuit 30 in a local oscillator 25. The tuned circuit 30 also includes a blocking capacitor 29 and a voltage variable capacitor 31.

An intermediate frequency signal then is obtained from the output of the mixer 33 and is amplified in an IF amplifier stage 35. The signal from the IF amplifier 35 is detected by a detector 37 and is coupled to an audio amplifier 40, the output of which drives a speaker 42.

The tuned circuits, 11, 18 and 30 are similar to one another, with the exception that the tuned circuit 30 includes an additional blocking capacitor 32 connected between the cathode of the voltage variable capacitor 31 and the grounded terminal of the winding 27. All of these tuned circuits are tuned in a similar manner by varying the DC bias potential applied across the voltage variable capacitors 14, 20 and 31 by means of a DC control potential applied through isolating resistors 46, 47, 48 to the anodes of the voltage variable capacitors over a lead 51 which is connected to the output of a stabilized DC supply voltage circuit 50 in the form of a bridge connected between a source of B+ and ground potential.

The bridge 50 includes four arms with the first, second and third arms including resistors 55, 56 and 52, respectively. The fourth arm includes a pair of silicon diodes 53 connected in series with a Zener diode 54. The diagonal of the bridge connected between the junction of the resistor 52 and the diodes 53 and the junction of the resistors 55 and 56 includes a potentiometer 57 and a resistor 58 connected in series. The tap on the potentiometer 57 is connected to the lead 51 to provide the variable DC control voltage which is used to tune the voltage variable capacitors 14, 20 and 31 in the tuned circuits of the receiver.

It is possible to obtain a highly regulated DC voltage from the tap on the potentiometer 57 by the use of the voltage-regulated source shown in FIG. 1, even though the Zener diode 54 is a poor Zener, i.e. one which does not provide an absolutely constant voltage drop thereacross as the current flowing through it varies in response to variations in the value of the B+ applied to the bridge circuit. This is accomplished by causing the resistor 55 to be of substantially greater magnitude than the resistor 56, so that the variations in the voltage drop across the resistor 56 are substantially equal to the variations in the voltage drop which occur across the Zener diode 54 over the normal range of fluctuations which can be expected from the B+ source. With the circuit adjusted in this manner, the potential difference between the two output junctions, across which the potentiometer 57 and resistor 58 are connected, is held at a relatively constant level throughout any of the normal fluctuations encountered in the B+ power supply. For example if the drop across the Zener diode 54 ranges between 9.0 and 9.5 volts for the total B+ fluctuations, the resistor 56 is chosen to give a range of voltage drop of 1.0 to 1.5 volts for the same B+ fluctuations. Thus, the tuning voltage applied to the lead 51 is constant for a given setting of the tap on the potentiometer 57 in spite of voltage variations of the BB+ supply.

In order to provide tracking of the tuning of the tuned circuits 11, 18 and 30, and in addition to provide the desired voltage offset, so that the tuning frequencies of these tuned circuits are different for the same DC tuning voltage applied to the tuned circuit over the lead 51, it is necessary to provide some type of offset voltage for biasing the different tuned circuits. This is accomplished by obtaining a reference voltage for the voltage variable capacitor 31 in the tuned circuit 30 from the junction of the resistors 55, 56, 58 in the voltage regulator supply circuit and connecting this potential to the junction between the cathode of the voltage variable capacitor 31 and the blocking capacitor 32 over a lead 59. It can be seen from an examination of FIG. 1 that this voltage is at some potential above ground determined by the voltage drop across the resistor 56. At the same time, the cathodes of the voltage variable capacitors 14 and 20 in the antenna tuned circuit 11 and the RF tuned circuit 18 are connected to ground; so that with the same control potential being applied to the anodes of all of the voltage variable capacitors 14, 20 and 31 from the tap on the potentiometer 57, the total voltage applied across the voltage variable capacitors 14 and 20 is greater than the voltage applied across the capacitor 31 due to the fact that a higher reference potential is applied to the cathode of the capacitor 31 over the lead 59.

This difference in the total biasing potential applied across the voltage variable capacitors 31 and 14 or 20 causes a lower voltage to be applied across the capacitor 31, thereby resulting in a higher capacitance for any given setting of the potentiometer tap of the potentiometer 57 than is obtained from the voltage variable capacitors 14 and 20, since voltage variable capacitors of the type shown in the drawing exhibit a decrease in capacitance with increasing voltages applied thereacross. As a consequence, the resonant frequency of the tuned circuits 11 and 18 is higher than the resonant frequency of the tuned circuit for any given control voltage on the lead 51, provided all other parameters of the tuned circuits are equal. Thus, it is possible to provide the desired offset between the frequencies of the antenna and RF stages with the oscillator frequency without the addition of extra trimming capacitors or padding condensers in the circuit. This predetermined offset of the resonant frequencies with different tuning control voltages occurs throughout the tuning range of the circuit. The resistor 58 is provided to establish a lower limit of the potential which may be applied across the tuning capacitors 14, 20 and 31 used in the tuned circuits.

The offset voltage and the offset relationship between the tuned circuits 11 or 18 and the tuned circuit 30 may be better understood by reference to FIG. 2. Line B shows the variation in resonant frequency with increasing voltage of either of the tuned circuits 11 or 18, and line A shows the variation in resonant frequency of the tuned circuit 30 with increasing voltages applied thereto over the lead 51.

It can be seen that for any given voltage applied over the lead 51, the resonant frequency of the tuned circuits 11 or 18 as shown on line B is higher than the resonant frequency of the tuned circuit 30 as shown on Line A. This offset in the frequencies is indicated by the two vertical dotted lines in FIG. 2; and since the lines A and B are parallel, this offset is constant for increasing tuning voltages applied to the lead 51. Thus, the tuned circuits 11, 18 and 30 track one another accurately but offset at different frequencies by the use of the circuit shown in FIG. 1.

The diodes 53 are chosen to be silicon diodes having a characteristic such that with changes in the ambient temperature, the diodes 53 operating in their forward current conducting direction act to offset changes in the voltage drop across the Zener diode 54 caused by the same changes in ambient temperature. By using the silicon diodes 53 in the circuit in series with the Zener diode 54, it is possible to provide a circuit which provides a constant output voltage in a temperature range between approximately minus 40° F. and plus 165° F. If the circuit is operated in an environment in which the ambient temperature does not vary over a very wide range, it is possible to eliminate the diodes 53 from the circuit, with the remainder of the operation of the circuit being the same as described previously.

We claim:

1. A circuit for simultaneously tuning a plurality of resonant circuits, each including as a part thereof a voltage variable capacitance means, said circuit including in combination:

a source of direct current potential;

tuning control voltage means connected to the source of direct current potential for providing a variable DC tuning potential from said source;

reference voltage means connected to the source of direct current potential for providing different DC reference voltage outputs;

means for connecting different outputs of the reference voltage means to different ones of the resonant circuits including the voltage variable capacitors; and means for connecting the variable DC tuning potential obtained from the tuning control voltage means to all of the resonant circuits to simultaneously tune the circuits, with the tuning of the circuits having predetermined offsets established by the different reference voltage outputs provided by said reference voltage means.

2. The combination according to claim 1 further including a bridge circuit having first, second, third, and fourth arms, with said first, second and third arms comprising resistors and said fourth arm including a constant voltage means providing a predetermined voltage drop thereacross for currents in a predetermined range flowing therethrough, and wherein the tuning control voltage means is connected in a diagonal between the junction of the first and second resistors and the junction of the third resistor and the constant voltage means, and the source of direct current potential is connected between the junction of the first and third resistors and the junction of the second resistor and the constant voltage means.

3. The combination according to claim 2 wherein the constant voltage means includes a Zener diode and the tuning control voltage means is a potentiometer, the tap of which is connected to a similar point in all of the resonant circuits.

4. The combination according to claim 3 wherein the DC reference voltage means for at least one of the resonant circuits is obtained from a tap on said diagonal and the DC reference voltage means for at least one other resonant circuit is obtained from one of the junctions to which the source of direct current potential is connected.

5. The combination according to claim 1 further including a bridge circuit having four arms interconnected at first and second input junctions and first and second output junctions, with the first and second input junctions being connected between said direct current source and a point of reference potential; and wherein said tuning control voltage means includes, a potentiometer connected across the first and second output junctions of said bridge, said potentiometer having a tap for providing said variable DC tuning potential, and the relative impedances of said arms being such as to cause said bridge to be unbalanced to provide a potential difference across said potentiometer.

6. The combination according to claim 5 further wherein the means for providing different DC reference voltage outputs includes means for obtaining the voltages present on at least two different junctions on said bridge circuit, said junctions being at different voltage levels.

7. The combination according to claim 6 wherein one of said reference voltage outputs is obtained from the point of reference potential and the other of said reference voltage outputs is obtained from one of said output junctions of said bridge.

8. A continuous wave signal translation device including at least an RF tuned circuit and a variable frequency oscillator, the RF tuned circuit and said oscillator each including a tunable resonant circuit having a voltage responsive variable capacitance device therein for selecting the frequency of said tuned circuits to accomplish tuning of said wave signal translation device, said device including in combination:

a source of direct current potential;

a bridge circuit having first and second input terminals and first and second output terminals, with said first and second input terminals connected between said source of direct current potential and a point of reference potential;

control means connected across said first and second output terminals for deriving a variable DC control potential;

reference means connected to the bridge circuit for providing different DC reference voltages therefrom;

first connecting means for connecting different ones of the different DC reference voltages to each of said resonant circuits; and second connecting means for connecting the variable DC control potential to the voltage variable capacitance devices in each of the resonant circuits to effect tuning simultaneously of each of said resonant circuits, the resonant circuits being simultaneously tuned to different frequencies as established by the different reference voltages connected thereto.

9. The combination according to claim 8 wherein the bridge circuit is a four-arm bridge circuit, three of the arms of which constitute resistor means and the fourth arm of which includes a Zener diode.

10. The combination according to claim 9 wherein the control means connected across said first and second output terminals of the bridge includes a potentiometer, the tap of which provides the variable DC control potential, and wherein one of the different reference voltages obtained from the bridge is obtained from one of said first or second output terminals and wherein a second of the reference voltages obtained from the bridge is obtained from said point of reference potential.

11. The combination according to claim 10 wherein each of the resonant circuits is a parallel tuned circuit including a voltage variable capacitor and a blocking capacitor connected in parallel with an inductance and further wherein the reference voltage and the variable voltage are connected across the voltage variable capacitor in each of said tuned circuits.

12. The combination according to claim 10 wherein the arm of the bridge including the Zener diode further includes temperature-compensating means connected in series with the diode.

13. The combination according to claim 12 wherein the temperature-compensating means includes a silicon diode connected in series with the Zener diode.

* * * * *